(12) United States Patent
Jang et al.

(10) Patent No.: US 12,414,285 B2
(45) Date of Patent: Sep. 9, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN); Jo-Lan Chin, Hefei (CN); Minki Hong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 498 days.

(21) Appl. No.: 17/932,418

(22) Filed: Sep. 15, 2022

(65) Prior Publication Data
US 2023/0345698 A1  Oct. 26, 2023

Related U.S. Application Data

(63) Continuation of application No. PCT/CN2022/111403, filed on Aug. 10, 2022.

(30) Foreign Application Priority Data

Apr. 26, 2022 (CN) .......................... 202210451692.6

(51) Int. Cl.
H10B 12/00 (2023.01)
(52) U.S. Cl.
CPC ........... *H10B 12/05* (2023.02); *H10B 12/315* (2023.02)
(58) Field of Classification Search
CPC ....... H10B 12/05; H10B 12/315; H10B 12/31
See application file for complete search history.

(56) References Cited

U.S. PATENT DOCUMENTS 7,478,294 B2   1/2009  Rong et al.
8,502,186 B2   8/2013  Chung
(Continued)

FOREIGN PATENT DOCUMENTS

CN   100444287 C   12/2008
CN   101897008 A   11/2010
(Continued)

OTHER PUBLICATIONS

International Search Report cited in PCT/CN2022/109754 mailed Jan. 17, 2023, 9 pages.
(Continued)

*Primary Examiner* — Marlon T Fletcher
*Assistant Examiner* — Samuel Jonathan Smith
(74) *Attorney, Agent, or Firm* — Kilpatrick Townsend & Stockton LLP

(57) ABSTRACT

The present disclosure provides a semiconductor structure and a manufacturing method thereof. The semiconductor structure includes: a base including bit lines arranged at intervals and extending along a first direction, and a semiconductor channel located on partial top surfaces of the bit lines, where along a direction from the bit line to the semiconductor channel, the semiconductor channel includes a first region, a second region, and a third region that are arranged sequentially; a dielectric layer located between adjacent two of the bit lines and on a sidewall of the semiconductor channel; a gate structure at least surrounding the dielectric layer in the second region and extending along a second direction, where the first direction is different from the second direction; an electrical connection layer covering a top surface of the third region and extending to a partial sidewall of the semiconductor channel.

18 Claims, 10 Drawing Sheets

(56) References Cited

U.S. PATENT DOCUMENTS

| | | | |
|---|---|---|---|
| 9,147,595 | B2 | 9/2015 | Lee et al. |
| 10,181,472 | B1 | 1/2019 | Huang |
| 10,388,659 | B2 | 8/2019 | Zhang |
| 10,546,862 | B1 | 1/2020 | Yang et al. |
| 11,069,679 | B2 | 7/2021 | Wu et al. |
| 2008/0251825 | A1 | 10/2008 | Lee |
| 2011/0012085 | A1* | 1/2011 | Deligianni ......... H10D 30/6735 257/E21.409 |
| 2011/0121396 | A1* | 5/2011 | Lee ....................... G11C 11/403 257/E29.264 |
| 2013/0234240 | A1 | 9/2013 | Moon et al. |
| 2013/0323920 | A1* | 12/2013 | Chang .................... H10B 12/01 438/586 |
| 2016/0247892 | A1 | 8/2016 | Masuoka et al. |
| 2018/0248018 | A1 | 8/2018 | Park et al. |
| 2019/0035795 | A1 | 1/2019 | Boemmels |
| 2019/0067459 | A1 | 2/2019 | Balakrishnan et al. |
| 2022/0037483 | A1* | 2/2022 | Lowe .................. G11C 11/4023 |
| 2022/0068922 | A1 | 3/2022 | Chen et al. |

FOREIGN PATENT DOCUMENTS

| | | |
|---|---|---|
| CN | 102779828 A | 11/2012 |
| CN | 103904115 A | 7/2014 |
| CN | 109216278 A | 1/2019 |
| CN | 107039084 B | 4/2020 |
| CN | 109712976 B | 2/2021 |
| CN | 113838802 A | 12/2021 |
| CN | 114141712 A | 3/2022 |
| CN | 114203806 A | 3/2022 |
| CN | 114784006 A | 7/2022 |

OTHER PUBLICATIONS

International Search Report cited in PCT/CN2022/111403 mailed Jan. 16, 2023, 10 pages.

International Search Report cited in PCT/CN2022/098253 mailed Nov. 30, 2022, 9 pages.

Non-final office action issued in U.S. Appl. No. 17/934,655 mailed on Mar. 28, 2025, 9 pages.

Non-final office action issued in U.S. Appl. No. 17/893,058 mailed on Mar. 14, 2025, 10 pages.

\* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/111403, filed on Aug. 10, 2022, which claims the priority to Chinese Patent Application No. 202210451692.6, titled "SEMICONDUCTOR STRUCTURE AND MANUFACTURING METHOD THEREOF" and filed with the China National Intellectual Property Administration (CNIPA) on Apr. 26, 2022. The entire contents of International Application No. PCT/CN2022/111403 and Chinese Patent Application No. 202210451692.6 are incorporated herein by reference.

TECHNICAL FIELD

The present disclosure relates, but is not limited, to a semiconductor structure and a manufacturing method thereof.

BACKGROUND

With the increasingly high integration density of the dynamic memory, while the arrangement manners of transistors in a dynamic memory array structure and the way to reduce the size of individual functional devices in the dynamic memory array structure are studied, it is necessary to consider the effect of small-scale functional devices on the overall electrical performance of the semiconductor structure.

When vertical gate-all-around (GAA) transistors are used as access transistors of the dynamic memory, the area occupied by the GAA transistors can reach $4F^2$ (F: the smallest pattern size available under given process conditions). In principle, this arrangement can improve the density and efficiency, but higher demands are placed on the electrical connection accuracy and conductive performance between small-sized functional devices, and higher demands are also placed on the overall electrical performance of the semiconductor structure.

SUMMARY

An overview of the subject described in detail in the present disclosure is provided below, which is not intended to limit the protection scope of the claims.

The present disclosure provides a semiconductor structure and a manufacturing method thereof.

A first aspect of the present disclosure provides a semiconductor structure, including: a base including bit lines arranged at intervals and extending along a first direction, and a semiconductor channel located on partial top surfaces of the bit lines, where along a direction from the bit line to the semiconductor channel, the semiconductor channel includes a first region, a second region, and a third region that are arranged sequentially; a dielectric layer located between adjacent two of the bit lines and on a sidewall of the semiconductor channel; a gate structure at least surrounding the dielectric layer in the second region and extending along a second direction, where the first direction is different from the second direction; an electrical connection layer covering a top surface of the third region and extending to a partial sidewall of the semiconductor channel, where the electrical connection layer and the dielectric layer cover a surface of the semiconductor channel; and an insulating layer located between adjacent two of the semiconductor channels on a same bit line and isolating the gate structure as well as the dielectric layer on adjacent two of the dielectric layers.

A second aspect of the present disclosure provides a method of manufacturing a semiconductor structure, including: providing a base, where the base includes bit lines arranged at intervals and extending along a first direction, and a semiconductor channel located on partial top surfaces of the bit lines, and along a direction perpendicular to the top surface of the bit line, the semiconductor channel includes a first region, a second region, and a third region that are arranged sequentially; forming a dielectric layer, where the dielectric layer is located between adjacent two of the bit lines and on a sidewall of the semiconductor channel; forming a gate structure, where the gate structure at least surrounds the dielectric layer in the second region and extends along a second direction, and the first direction is different from the second direction; forming an electrical connection layer, where the electrical connection layer covers a top surface of the third region and extends to a partial sidewall of the semiconductor channel, and the electrical connection layer and the dielectric layer cover a surface of the semiconductor channel; and forming an insulating layer, where the insulating layer is located between adjacent two of the semiconductor channels on a same bit line.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

Figure 1:
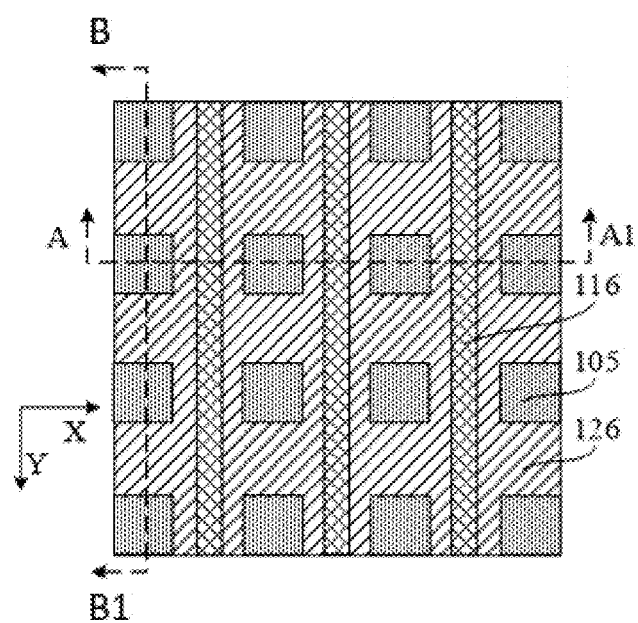
FIG. 1 is a schematic top view of a semiconductor structure according to an embodiment of the present disclosure.

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

As mentioned in the background, the electrical performance of the semiconductor structure in the prior art needs to be improved.

After analysis, it is found that in the current GAA transistor structure, the conduction or turn-off of the semiconductor channel is controlled by applying a voltage to the gate structure and the third region of the semiconductor channel. The third region of the semiconductor channel may receive an externally supplied voltage through the electrical connection layer. However, to achieve higher integration density, the sizes of both the gate structure and the semiconductor channel are further reduced, and the contact area between the electrical connection layer and the third region of the semiconductor channel is further reduced, which increase the difficulty of voltage control of semiconductor channels, thus reducing the electrical property of the semiconductor structure.

Embodiments of the present disclosure provide a semiconductor structure and a manufacturing method thereof. In the semiconductor structure, vertical GAA transistors are formed in a base, and a 3D stacked semiconductor structure can be formed, which are beneficial to improving the integration density of the semiconductor structure. In addition, the electrical connection layer covers the top surface of the third region of the semiconductor channel and extends to a partial sidewall of the semiconductor channel, which therefore is beneficial to increasing the contact area between the electrical connection layer and the semiconductor channel, reducing the contact resistance between the electrical connection layer and the third region of the semiconductor channel, and improving the transmission performance of electrical signals between the electrical connection layer and the third region of the semiconductor channel, thereby improving electrical properties of the semiconductor structure. Further, this is beneficial to improving the transmission performance of electrical signals between the other conductive structures and the third region of the semiconductor channel, when the conductive structures of other functional devices are subsequently formed on the electrical connection layer. Therefore, the embodiments of the present disclosure are beneficial to improving the ability of the electrical signal that the electrical connection layer transmits to the semiconductor channel to control the semiconductor channel, thereby improving the on/off sensitivity of the GAA transistor.

Figure 2:
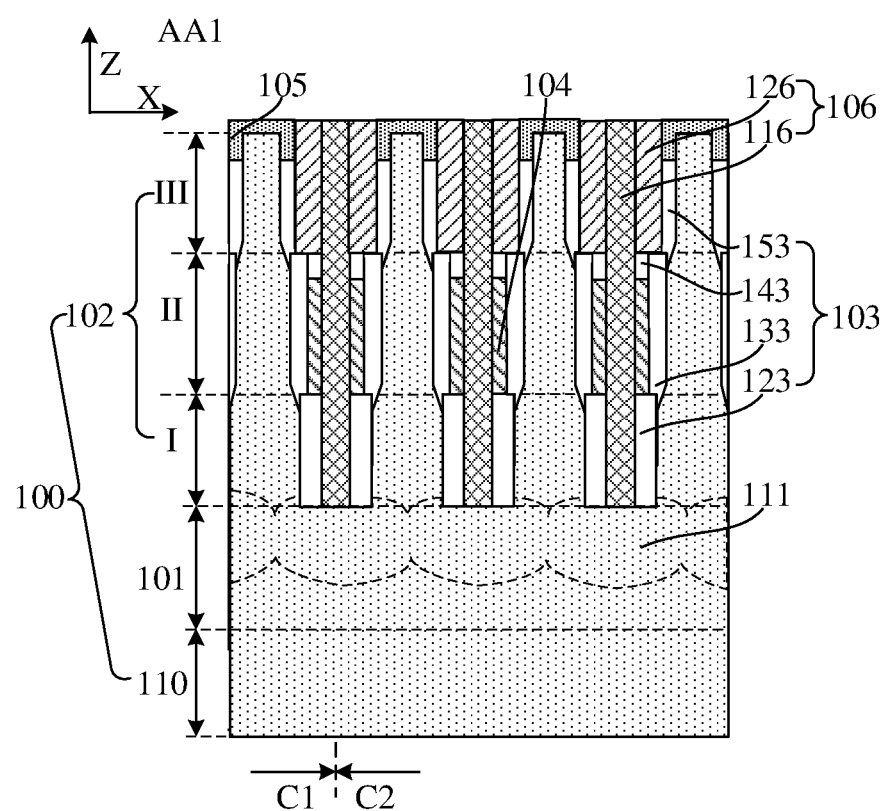
FIG. 2 is a schematic cross-sectional view of the semiconductor structure in FIG. 1 along a first cross-sectional direction AA1.
Figure 3:
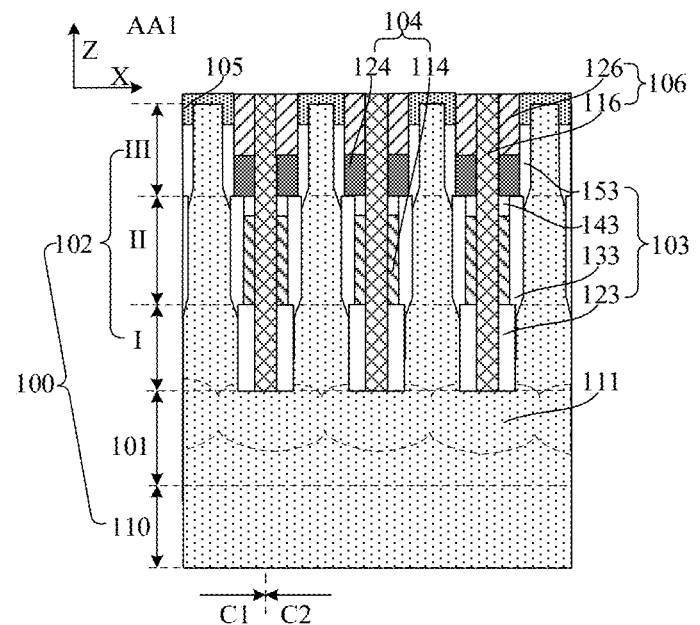
FIG. 3 is another schematic cross-sectional view of the semiconductor structure in FIG. 1 along the first cross-sectional direction AA1.
Figure 4:
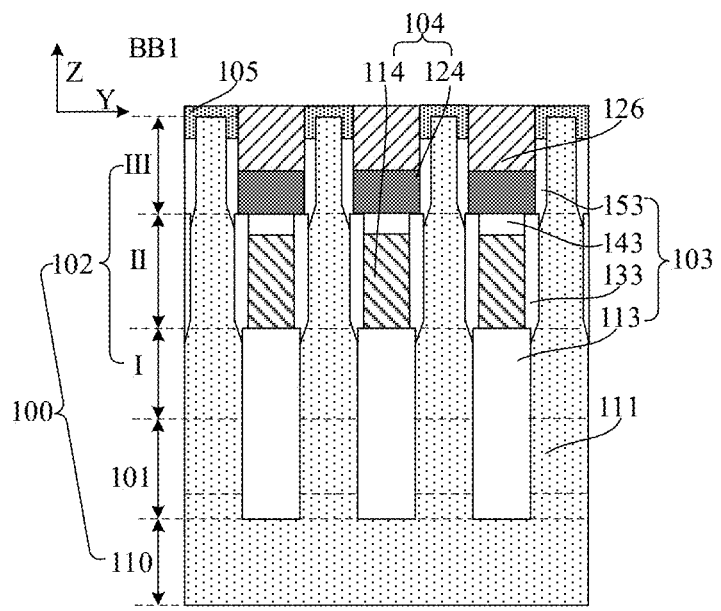
FIG. 4 is a schematic cross-sectional view of the semiconductor structure in FIG. 1 along a second cross-sectional direction BB1.

A first embodiment of the present disclosure provides a semiconductor structure. The semiconductor structure provided by the first embodiment of the present disclosure is described in detail below with reference to the drawings. FIGS. 1 to 5 are schematic structural views of the semiconductor structure according to an embodiment of the present disclosure. FIG. 1 is a schematic top view of a semiconductor structure according to an embodiment of the present disclosure; FIG. 2 is a schematic cross-sectional view of the semiconductor structure in FIG. 1 along a first cross-sectional direction AA1; FIG. 3 is another schematic cross-sectional view of the semiconductor structure in FIG. 1 along the first cross-sectional direction AA1; FIG. 4 is a schematic cross-sectional view of the semiconductor structure in FIG. 1 along a second cross-sectional direction BB1; and FIG. is a schematic cross-sectional view in which in the semiconductor structure in FIG. 1, a first gate layer surrounds a semiconductor channel, and a second gate layer surrounds the semiconductor channel.

With reference to FIGS. 1 to 5, the semiconductor structure includes: a base 100 including bit lines 101 arranged at intervals and extending along a first direction X, and a semiconductor channel 102 located on partial top surfaces of the bit lines 101, where along a direction Z from the bit lines 101 to the semiconductor channels 102, the semiconductor channel 102 includes a first region I, a second region II, and a third region III that are arranged sequentially; a dielectric layer 103 located between adjacent two of the bit lines 101 and on a sidewall of the semiconductor channel 102; a gate structure 104 at least surrounding the dielectric layer 103 in the second region II and extending along a second direction Y, where the first direction X is different from the second direction Y; an electrical connection layer 105 covering a top surface of the third region III and extending to a partial sidewall of the semiconductor channel 102, where the electrical connection layer 105 and the dielectric layer 103 cover a surface of the semiconductor channel 102; and an insulating layer 106 located between adjacent two of the semiconductor channels 102 on a same bit line 101 and isolating the gate structure 104 as well as the dielectric layer 105 on adjacent two of the dielectric layers 103.

With reference to FIG. 2, the semiconductor channel 102, the dielectric layer 103 surrounding the sidewall of the semiconductor channel 102, and the gate structure 104 form a vertical GAA transistor. The base 100 includes a substrate 110, and the bit line 101 is located between the substrate 110 and the GAA transistor, such that a 3D stacked semiconductor structure can be formed, which is beneficial to improving the integration density of the semiconductor structure.

It should be noted that, with reference to FIG. 2, both the first region I and the third region III can be used as the source or drain of the GAA transistor, and the gate structure 104 is configured to control the turn-on/off of the GAA transistor.

In some embodiments, with reference to FIG. 1, the first direction X is perpendicular to the second direction Y, such that the semiconductor channels 102 are arranged in a $4F^2$ manner (F: the smallest pattern size available under given process conditions), which is beneficial to improving the integration density of the semiconductor structure. In practical applications, the first direction X only needs to intersect the second direction Y, and the angle between the two may not be 90°.

With reference to FIG. 2, the electrical connection layer 105 not only covers the top surface of the third region III of the semiconductor channel 102, but also extends to a partial sidewall of the semiconductor channel 102, which therefore is beneficial to increasing the contact area between the electrical connection layer 105 and the third region III, reducing the contact resistance between the electrical connection layer 105 and the third region III, and improving the transmission performance of electrical signals between the electrical connection layer 105 and the third region III, thereby improving electrical properties of the semiconductor structure.

It should be noted that, with reference to FIG. 2, a plurality of spaced-apart bit lines 101 may be formed in the base 100, and the bit lines 101 each may be in contact with at least one first region I. FIGS. 1 to 4 show four spaced-apart bit lines 101, where the bit lines 101 each are in contact with four first regions I. In the practical application, the quantity of the bit lines 101 and the quantity of the first regions I in contact with each of the bit lines 101 may be set properly according to actual electrical requirements.

The embodiments of the present disclosure are further described in detail below with reference to FIGS. 1 to 5.

In some embodiments, with reference to FIG. 2, the base 100 may be made of an elemental semiconductor material or a crystalline inorganic compound semiconductor material. The elemental semiconductor material may include silicon or germanium, and the crystalline inorganic compound semiconductor material may include silicon carbide, silicon germanium, gallium arsenide or indium gallium.

In some embodiments, with reference to FIG. 2, the base 100 includes a bit line 101 and a semiconductor channel 102. If the base 100, the bit lines 101 and the semiconductor channels 102 have the same semiconductor element, the semiconductor channel 102 and the bit line 101 may be formed by using the same film structure. The film structure is composed of the semiconductor element, such that the semiconductor channels 102 and the bit lines 101 are integrated, thereby avoiding an interface state defect between the semiconductor channels 102 and the bit lines 101 and improving the performance of the semiconductor structure.

The semiconductor element may include at least one selected from the group consisting of silicon, carbon, germanium, arsenic, gallium and indium. Subsequent description is made by using an example in which both the bit line 101 and the semiconductor channel 102 both include the silicon element.

In some embodiments, with reference to FIG. 2, the semiconductor channel 102 may include doping elements, which is beneficial to improving the conductivity of the semiconductor channel 102. Therefore, this is beneficial to reducing the turn-on voltage between the first region I and the third region III, that is, the turn-on voltage between the source and the drain of the GAA transistor. The doping element is a P-type doping element or an N-type doping element. For example, the N-type doping element may be at least one of arsenic, phosphorus, or antimony; and the P-type doping element may be at least one of boron, indium, or gallium.

In some embodiments, the GAA transistor may be a junctionless transistor, that is, the doping elements in the first region I, the second region II, and the third region III are of the same type. The "junctionless" here refers to no PN junction, that is, the first region I, the second region II, and the third region III have the same concentration. In this way, there is no need to perform additional doping in the first region I and the third region III, thereby avoiding the problem that the doping process in the first region I and the third region III is difficult to control. Especially as the size of the transistor is further reduced, if the first region I and the third region III are additionally doped, the doping concentration will become more difficult to control. In addition, because the device is a junctionless transistor, it avoids the use of an ultra-steep source/drain doping process to make an ultra-steep PN junction in a nanoscale range. Therefore, problems such as threshold voltage drift and leakage current increase caused by abrupt changes in the doping concentration can be avoided, and the short channel effect can be suppressed. Such a design further improves the integration density and electrical performance of the semiconductor structure. Understandably, the additional doping herein refers to doping to make the types of the doping elements in the first region I and the third region III different from that of the doping element in the second region II.

In some embodiments, with reference to FIG. 3 and FIG. 4, the dielectric layer 103 may include: a first dielectric layer 113 located between adjacent bit lines 101 and between the semiconductor channels 102 of the first regions I on the adjacent bit lines 101; the second dielectric layer 123 located on the sidewall of the semiconductor channel 102 in the first region and the sidewall of the first dielectric layer 113 in the first region I; the third dielectric layer 133 surrounding the sidewall of the semiconductor channel 102 in the second region II; a fourth dielectric layer 143 located between the third dielectric layer 133 and the insulating layer 106 and spaced between the first gate layer 114 and the second gate layer 124; and the fifth dielectric layer 153, where the fifth dielectric layer and the electrical connection layer 105 cover the surface of the semiconductor channel 102 in the third region III.

With reference to FIGS. 3 and 4, the first dielectric layer 113 between adjacent bit lines 101 is configured to electrically insulate adjacent bit lines 101. The first dielectric layer 113, the second dielectric layer 123 and the insulating layer 106 between the semiconductor channels 102 of the first regions I on adjacent bit lines 101 work together, to electrically insulate the semiconductor channels 102 in the first region I spaced along the first direction X and/or the second direction Y. The third dielectric layer 133 surrounding the sidewall of the semiconductor channel 102 in the second region II may be configured to isolate the first gate layer 114 from the semiconductor channel 102 in the second region II. The third dielectric layer 133 and the fourth dielectric layer 143 may be configured to jointly isolate the first gate layer 114 and the second gate layer 124. The fifth dielectric layer 153 surrounding the surface of the semiconductor channel 102 in the third region III and the insulating layer 106 work together, to electrically insulate the semiconductor channels 102 in the third region III spaced along the first direction X and/or the second direction Y.

In some embodiments, with reference to FIG. 3, the third dielectric layer 133 may further be located on a partial sidewall of the second dielectric layer 123, which is beneficial to further ensuring the insulation between the first gate layer 114 and the semiconductor channel 102. The fifth dielectric layer 153 may further be located on a partial sidewall of the third dielectric layer 133, which is beneficial to further ensuring the insulation between the second gate layer 124 and the semiconductor channel 102.

In some embodiments, with reference to FIGS. 3 and 4, the first dielectric layer 113, the second dielectric layer 123, the third dielectric layer 133, the fourth dielectric layer 143, and the fifth dielectric layer 153 may be made of a same material, such as, silicon oxide. In another embodiment, the five dielectric layers may be made of different materials, provided that these materials have good insulating effects.

The specific structure of the gate structure 104 is described in detail below through two embodiments.

In some embodiments, with reference to FIG. 2, the gate structure 104 surrounds the dielectric layer 103 of the second region II and extends along the second direction Y (with reference to FIG. 1).

In other embodiments, with reference to FIGS. 3 and 4, the gate structure 104 includes: a first gate layer 114 surrounding the dielectric layer 103 in the second region II and extending along the second direction Y (with reference to FIG. 1); and the second gate layer 124 surrounding the dielectric layer 103 of the third region III, and in the direction Z perpendicular to the top surface of the bit line 101, where the second gate layer 124 is spaced from the first gate layer 114.

In this way, the first gate layer 114 and the second gate layer 124 are designed to control the same semiconductor channel 102, such that the capabilities of the first gate layer 114 and the second gate layer 124 to control the semiconductor channel 102 complement each other. When the lack of turn-off capability of the semiconductor channel 102 in one of the gate layers results in a large leakage current, such as GIDL (gate-induced drain leakage), the semiconductor channel 102 is turned off by using another gate layer, thereby ensuring good capabilities of the first gate layer 114 and the second gate layer 124 to control the semiconductor channel 102 on the whole. This is beneficial to reducing the leakage current in the semiconductor structure, to improve the overall electrical performance of the semiconductor structure.

The specific situation that the gate structure 104 includes the first gate layer 114 and the second gate layer 124 is described in detail below with reference to FIGS. 3 to 5.

In some embodiments, with reference to FIG. 3, in a plane perpendicular to the sidewall of the semiconductor channel 102, the first gate layer 114 surrounds the semiconductor channel 102, that is, the second region II has a first cross section. The second gate layer 124 surrounds the semiconductor channel 102, that is, the third region III has a second cross section. The area of the first cross section is greater than that of the second cross section. In this way, the cross-sectional area of the third region III is smaller, which is beneficial to improving the ability of the second gate layer 124 to control the semiconductor channel 102. In other words, the smaller the threshold voltage required, the easier it is to turn on or off the GAA transistor. It is further beneficial to adjusting the ability of the second gate layer 124 to control the semiconductor channel 102 to compensate for the instability of the ability of the first gate layer 114 to control the semiconductor channel 102, thereby ensuring the overall controllability of the semiconductor channel 102, to improve the overall electrical performance of the semiconductor structure.

The ratio of the area of the first cross section to that of the second region may be 1.5 to 2.5.

In some embodiments, with reference to FIG. 3, in a plane perpendicular to the sidewall of the semiconductor channel 102, a cross-sectional area of the semiconductor channel 102 in the first region I, a cross-sectional area of the semiconductor channel 102 in the second region II, and the cross-sectional area of the semiconductor channel 102 in the third region III are decreased sequentially.

With reference to FIG. 3, along the first direction X, the side surface of the second gate layer 124 away from the sidewall of the semiconductor channel 102 is flush with that of the first gate layer 114 away from the sidewall of the semiconductor channel 102. In this way, it is beneficial to further increasing the overall volume of the second gate layer 124, and improving the conductivity of the second gate layer 124, thereby improve the ability of the second gate layer 124 to receive electrical signals, such that on/off of the semiconductor channel 102 can be controlled by applying a smaller voltage to the second gate layer 124, to improve the on/off sensitivity of GAA transistors.

In some embodiments, with reference to FIGS. 1 to 4, in directions perpendicular to the sidewalls of the semiconductor channel 102, that is, along the first direction X and the second direction Y, the first gate layer 114 is thinner than the second gate layer 124. Along the direction Z from the bit line 101 to the semiconductor channel 102, the first gate layer 114 is higher than the second gate layer 124. In this way, it is beneficial to properly using the gap between adjacent semiconductor channels 102 to design the dimensions of the first gate layer 114 and the second gate layer 124, to reduce the difference between the volume of the first gate layer 114 and the volume of the second gate layer 124, such that both the first gate layer 114 and the second gate layer 124 each have a suitable volume. This is beneficial to reducing the difference between the conductivity of the first gate layer 114 and the conductivity of the second gate layer 124, to reduce the difference in the abilities of the first gate layer 114 and the second gate layer 124 to control the semiconductor channel 102, thereby ensuring good ability of the first gate layer 114 and the second gate layer 124 to control the semiconductor channel 102 on the whole, reducing the leakage current in semiconductor structures, and improving the overall electrical performance of the semiconductor structure.

In addition, with reference to FIG. 3, along the direction Z, the first gate layer 114 may be higher than the second gate layer 124, which is beneficial to ensuring a larger surrounding area of the semiconductor channel 102 by the first gate layer 114, and improving the ability of the first gate layer 114 to control the semiconductor channel 102. The ratio of the length of the first gate layer 114 to that of the second gate layer 124 may be 1.5 to 4.

In some embodiments, with reference to FIG. 4, along the direction Z from the bit line 101 to the semiconductor channel 102, a ratio of the height of the first gate layer 114 surrounding the sidewall of the second region II to that of the semiconductor channel 102 of the second region II is 1/2 to 9/10. In this way, a ratio of the height of the third dielectric layer 133 covering the sidewall of the semiconductor channel 102 in the second region II to that of the first gate layer 114 is 1/2 to 9/10, such that there is an appropriate distance between the first gate layer 114 and the top surface of the semiconductor channel 102 in the second region II, and along the direction Z, there is an appropriate distance between the first gate layer 114 and the second gate layer 124, to reduce the parasitic effect between the first gate layer 114 and the second gate layer 124, thereby improving the electrical performance of the semiconductor structure.

In some embodiments, with reference to FIG. 4, along the direction Z from the bit line 101 to the semiconductor channel 102, a ratio of the height of the second gate layer 124 surrounding the sidewall in the third region III to that of the semiconductor channel 102 in the third region III is 1/2 to 9/10. In this way, it is beneficial to having an appropriate distance between the second gate layer 124 and the top surface of the semiconductor channel 102 in the third region III, such that along the direction Z, there is an appropriate distance between the second gate layer 124 and the electrical connection layer 105, to reduce the parasitic effect between the second gate layer 124 and the electrical connection layer 105, thereby improving the electrical performance of the semiconductor structure.

Figure 5:
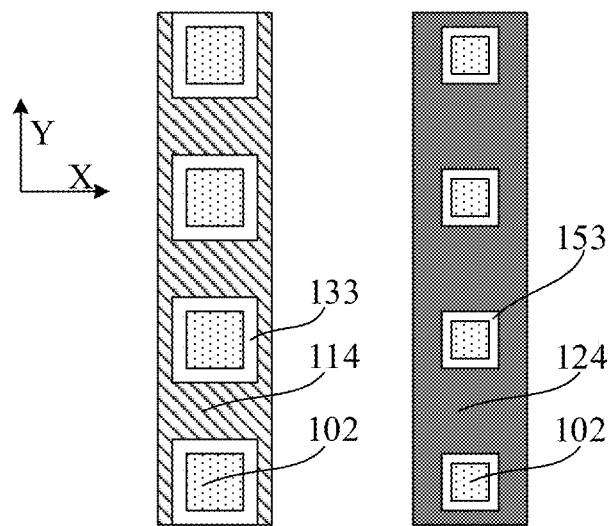
FIG. 5 is a schematic cross-sectional view in which in the semiconductor structure in FIG. 1, a first gate layer surrounds a semiconductor channel, and a second gate layer surrounds the semiconductor channel.

In some embodiments, with reference to FIG. 5, a single first gate layer 114 extends along the second direction Y and surrounds adjacent semiconductor channels 102 on adjacent bit lines 101; and a single second gate layer 124 extends along the second direction Y and surrounds adjacent semiconductor channels 102 on adjacent bit lines 101.

With reference to FIG. 5, both materials of the first gate layer 114 and the material of the second gate layer 124 may include at least one selected from the group consisting of polysilicon, titanium nitride, tantalum nitride, copper or tungsten. In some embodiments, the second gate layer 124 may include at least one of lanthanides and/or zirconium. In this way, it is beneficial to improving the electrical performance of the second gate layer 124, thereby improving the ability of the second gate layer 124 to control the semiconductor channel 102. In addition, at least one of lanthanides and/or zirconium are/is doped into the second gate layer 124 to improve the conductivity of the second gate layer 124. This is beneficial to further avoiding the conductivity difference between the first gate layer 114 and the second gate layer 124, and reducing the difference in the abilities of the first gate layer 114 and the second gate layer 124 to control the semiconductor channel 102, thereby improving the overall stability of the semiconductor structure.

In some embodiments, with reference to FIG. 4, the vertical distance between the top surface of the first gate layer 114 away from the bit line 101 and the bottom surface of the second gate layer 124 close to the bit line 101 may be 20 nm to 60 nm. In this way, a large parasitic capacitance is avoided between the first gate layer 114 and the second gate layer 124, mutual interference between the first gate layer 114 and the second gate layer 124 is reduced. This is beneficial to ensuring good abilities of the first gate layer 114 and the second gate layer 124 to control the semiconductor channel 102.

The electrical connection layer 105 in the semiconductor structure is described in detail below with reference to FIGS. 1 to 5.

In some embodiments, with reference to FIG. 2, the electrical connection layer 105 include at least one of lanthanides and/or zirconium. In this way, the electrical performance of the electrical connection layer 105 is improved, thereby improving the transmission effect of electrical signals in the electrical connection layer 105, to improve the ability of the electrical signal transmitted to the semiconductor channel 102 through the electrical connection layer 105 to control the semiconductor channel 102. This is beneficial to improving the on/off sensitivity of the GAA transistor.

In some embodiments, with reference to FIG. 2, along a direction Z from the bit line 101 to the semiconductor channel 102, the electrical connection layer 105 on the top surface of the third region III is 10 nm to 50 nm. In this way, while having good conductivity, the electrical connection layer 105 has an appropriate size, thereby avoiding taking up too much space in the semiconductor structure.

In some embodiments, with reference to FIGS. 3 and 4, along the directions perpendicular to the sidewalls of the semiconductor channel 102, that is, in the first direction X and the second direction Y, the ratio of the width of the electrical connection layer 105 located on the sidewall of the semiconductor channel 102 to that of the semiconductor channel 102 in the third region III is 1/5 to 3/5. In an example, along a direction perpendicular to the sidewall of the semiconductor channel 102, the width of the electrical connection layer 105 located on the sidewall of the semiconductor channel 102 may be 10 nm to 50 nm.

In some embodiments, with reference to FIG. 3, along the direction Z from the bit line 101 to the semiconductor channel 102, a ratio of the height of the electrical connection layer 105 on the sidewall the semiconductor channel 102 to that of the semiconductor channel 102 in the third region III is 1/5 to 3/5. In an example, along the direction Z, the height of the electrical connection layer 105 located on the sidewall of the semiconductor channel 102 may be 10 nm to 50 nm.

In some embodiments, with reference to FIG. 3, orthographic projection of the electrical connection layer 105 on the bit line 101 is not overlapped or partially overlapped with that of the gate structure 104 on the bit line 101. In an example, the orthographic projection of the electrical connection layer 105 on the bit line 101 is not overlapped with that of the gate structure 104 on the bit line 101. This is beneficial to avoiding that the electrical connection layer 105 faces the gate structure 104 in the direction Z, to reduce the mutual interference between the electrical connection layer 105 and the gate structure 104, such as a parasitic capacitance between the electrical connection layer 105 and the gate structure 104, thereby improving the electrical performance of the semiconductor structure. In another example, the orthographic projection of the electrical connection layer 105 on the bit line 101 is partially overlapped with that of the gate structure 104 on the bit line 101. This is beneficial to reducing the facing area between the electrical connection layer 105 and the gate structure 104, to reduce the mutual interference between the electrical connection layer 105 and the gate structure 104, thereby improving the electrical property of the semiconductor structure.

In some embodiments, with reference to FIG. 2, the semiconductor structure further includes a metal-semiconductor compound structure 111 at least located in a bit line opposite to a bottom of the insulating layer 106.

With reference to FIG. 2, the metal-semiconductor compound structure 111 have a smaller resistivity than an unmetallized semiconductor material. Therefore, compared to the semiconductor channel 102, the bit line 101 including the metal-semiconductor compound structure 111 has a smaller resistivity. This reduces the resistance of the bit lines 101 and the contact resistance between the bit lines 101 and the semiconductor channel 102 of the first region I, thereby further improving the electrical performance of the semiconductor structure. In addition, the resistivity of the bit line 101 may further be smaller than that of the substrate 110.

It should be noted that in some embodiments, with reference to FIG. 2, a region of the bit line 101 under the first doped region I may be made of a semiconductor material, and a partial region of the bit line 101 that is not covered by the first region I is made of a metal semiconductor compound. It may be understood that as the size of the device continues to shrink and the manufacturing process parameters are adjusted, a partial region of the bit line 101 under the first region I is made of a semiconductor material, and the remaining region of the bit line 101 under the first region I may also be made of a metal semiconductor compound. The "remaining region" here is located on a periphery of the "partial region".

For example, with reference to FIG. 2, the plurality of metal-semiconductor compound structures 111 in the bit line 101 communicate with each other to form a part of the bit line 101. Moreover, the metal-semiconductor compound structure 111 may be partially located in the bit line 101 and partially located in the semiconductor channel 102 in the first region I. In other embodiments, a plurality of metal-semiconductor compound structures in the same bit line may be spaced from each other.

In FIG. 2, the region of the base 100 defined by a dotted ellipse is a metal-semiconductor compound structure 111. In the practical application, the size of the contact region between adjacent metal-semiconductor compound structures 111 is not limited. In other embodiments, the entire bit line may be used as the metal-semiconductor compound structure 111.

In some embodiments, with reference to FIG. 2, along a direction from the semiconductor channels 102 at two sides of the insulating layer 106 to the insulating layer 106, that is, in the directions C1 and C2, the metal-semiconductor compound structure 111 becomes deeper.

An example in which the semiconductor element is silicon is made below. The material of the metal-semiconductor compound structure 111 includes at least one selected from the group consisting of cobalt silicide, nickel silicide, molybdenum silicide, titanium silicide, tungsten silicide, tantalum silicide and platinum silicide.

In some embodiments, with reference to FIG. 2, the insulating layer 106 includes: a first insulating layer 116 located between the dielectric layer 103 between adjacent semiconductor channels 102 and the gate structure 104 and extending along the second direction Y, where the top surface of the first insulating layer 116 is not lower than that of the semiconductor channel 102 in the third region III; and a second insulating layer 126 located on the top surface of the second gate layer 124 away from the bit line 101 and between the first insulating layer 116 and the electrical connection layer 105.

With reference to FIG. 2, the first insulating layer 116 and the second insulating layer 126 work together to electrically insulate adjacent semiconductor channels 102 along the first direction X, adjacent first gate layers 114, and adjacent second gate layers 124. In addition, the second insulating layer 126 on the top surface of the second gate layer 124 can electrically insulate the second gate layer 124 from another conductive structure.

In some embodiments, with reference to FIG. 2, the first insulating layer 116 and the second insulating layer 126 may be made of a same material, such as silicon nitride. In another embodiment, the two insulating layers may be made of different materials, provided that these materials have good insulating effects. In the same etching process, a high etch selectivity of a material of the insulating layer 106 to that of the dielectric layer 103 exists.

In summary, with reference to FIG. 2, the electrical connection layer 105 covers the top surface of the third region III of the semiconductor channel 102 and extends to a partial sidewall of the semiconductor channel 102, which therefore is beneficial to increasing the contact area between the electrical connection layer 105 and the semiconductor channel 102, reducing the contact resistance between the electrical connection layer 105 and the third region III of the semiconductor channel 102, and improving the transmission performance of electrical signals between the electrical connection layer 105 and the third region III of the semiconductor channel 102, thereby improving electrical properties of the semiconductor structure. Further, this is beneficial to improving the transmission performance of electrical signals between the other conductive structures and the third region III of the semiconductor channel 102, when the conductive structures of other functional devices are subsequently formed on the electrical connection layer 105. Therefore, the embodiments of the present disclosure are beneficial to improving the ability of the electrical signal that the electrical connection layer 105 transmits to the semiconductor channel 102 to control the semiconductor channel 102, thereby improving the on/off sensitivity of the GAA transistor.

Another embodiment of the present disclosure further provides a method of manufacturing a semiconductor structure, which is used to manufacture the semiconductor structure in the above embodiment. FIG. 6 to FIG. 18 are schematic structural cross-sectional views corresponding to various steps of a method of manufacturing a semiconductor structure according to another embodiment of the present disclosure. The method of manufacturing a semiconductor structure provided by another embodiment is described in detail below with reference to the drawings.

It should be noted that to conveniently describe and clearly illustrate the steps of the method of manufacturing a semiconductor structure, FIGS. 6 to 18 in this embodiment are all schematic partial structural diagrams of the semiconductor structure. In addition, parts that are the same as or corresponding to the foregoing embodiment are not described herein again.

Figure 6:
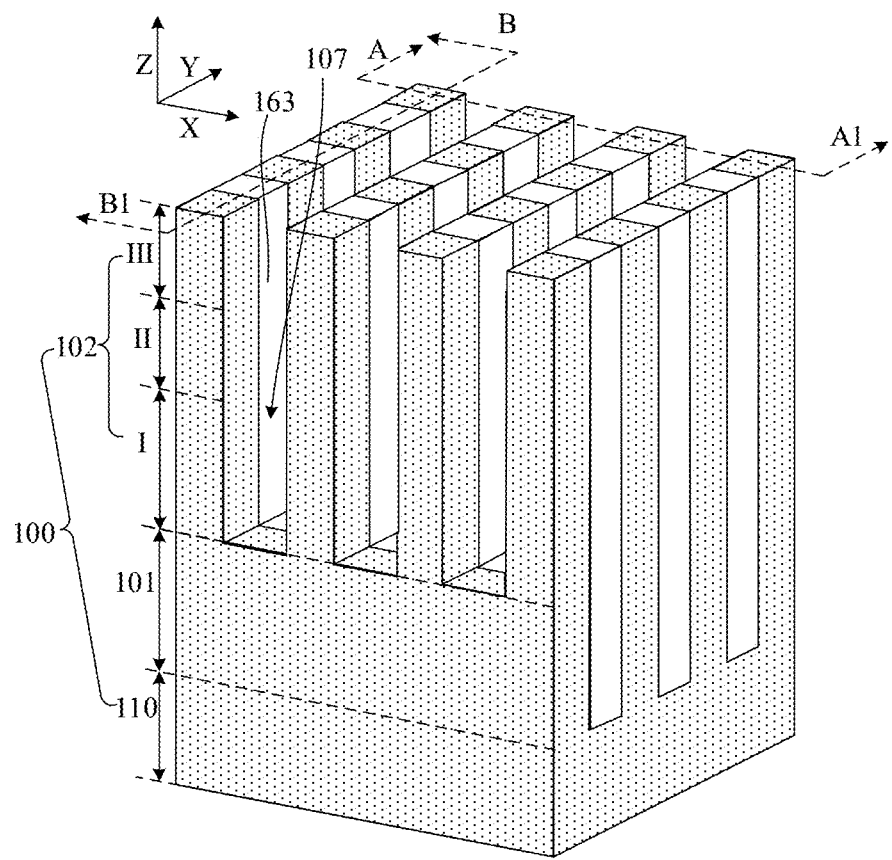
FIG. 6 to FIG. 18 are schematic structural cross-sectional views corresponding to various steps of a method of manufacturing a semiconductor structure according to another embodiment of the present disclosure.
Figure 7:
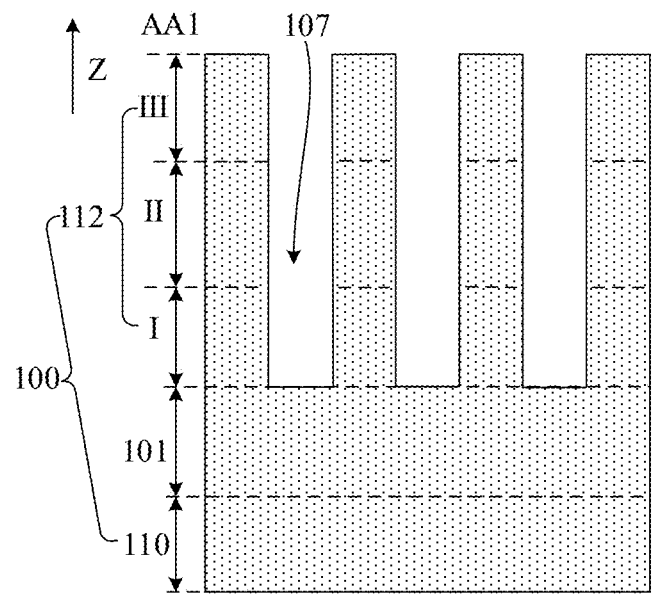
Figure 8:
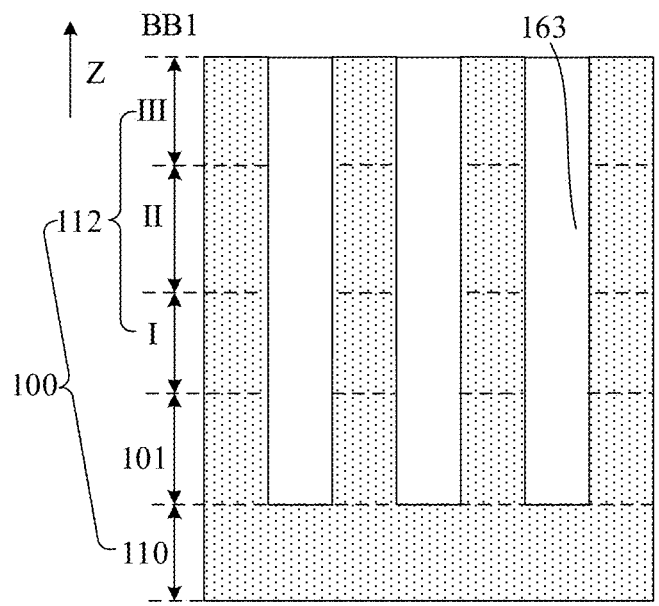

FIG. 7 is a schematic cross-sectional view of the structure in FIG. 6 along a first sectional direction AA1, and FIG. 8 is a schematic cross-sectional view of the structure in FIG. 6 along a second sectional direction BB1. It should be noted that, one or both of the schematic cross-sectional views along the first cross-sectional direction AA1 and the second cross-sectional direction BB1 are set according to the needs of the presentation.

With reference to FIGS. 6 to 18, the method of manufacturing the semiconductor structure includes: providing a base 100, where the base 100 includes bit lines 101 arranged at intervals and a semiconductor channel 102, the bit lines 101 extend along the first direction X, the semiconductor channel 102 is located on a part of the top surface of the bit line 101, and in the direction Z perpendicular to the top surface of the bit line 101, the semiconductor channel 102 includes a first region I, a second region II and a third region III that are arranged sequentially; and forming a dielectric layer 103, where the dielectric layer 103 is located between adjacent bit lines 101 and on a sidewall of the semiconductor channel 102.

It should be noted that both the first region I and the third region III may be used as the source or drain of the subsequently formed GAA transistor having the semiconductor channel 102. A part of the second region II corresponds to the first gate layer 114 of the GAA transistor to be formed subsequently, and a part of the third region III corresponds to the second gate layer 124 of the GAA transistor to be formed subsequently.

In some embodiments, the providing a base may include the steps: providing an initial base (not shown in the figure), where the initial first dielectric layer (not shown in the figure) extending along a first direction X is disposed in the initial base; with reference to FIGS. 6 to 8, patterning the initial base and the initial first dielectric layer, to form the bit lines 101 arranged at intervals, the semiconductor channel 102, and the initial first dielectric layer 163 located between adjacent bit lines 101, where a top surface of the initial first dielectric layer 163 is not lower than that of the semiconductor channel 102, the sidewall of the semiconductor channel 102, a sidewall of the initial first dielectric layer 163, and the partial top surface of the bit line 101 define a trench 107, and the trench 107 extends along the second direction.

It should be noted that, with reference to FIG. 6, the initial base is the basis for forming the bit line 101 and the semiconductor channel 102. When the initial base and the initial first dielectric layer 163 are patterned to form the bit line 101 and the semiconductor channel 102, a substrate 110 is formed.

In this embodiment, both the initial base and the initial first dielectric layer 163 may be formed through a self-aligned quadruple patterning (SAQP) process or a self-aligned double patterning (SADP) process.

In some embodiments, doping treatment and annealing treatment may also be performed on the initial base, such that the initial base is doped with N-type doping elements or P-type doping elements. This is beneficial to improving the conductivity of the semiconductor channel 102 formed on the basis of the initial base, thereby reducing the turn-on voltage between the first region I and the third region III, that is, reducing the turn-on voltage between the source and the drain of the GAA transistor formed subsequently. In addition, the initial base is doped with N-type doping elements or P-type doping elements to improve the conductivity of the bit line 101 formed on the basis of the initial base, thereby reducing the contact resistance between the first region I and the bit line 101, and improving the electrical property of the semiconductor structure.

With reference to FIGS. 9 to 18, a gate structure 104 is formed. The gate structure 104 surrounds at least the dielectric layer 103 in the second region II and extends along the second direction Y, and the first direction X is different from the second direction Y. An electrical connection layer 105 is formed. The electrical connection layer 105 covers the top surface of the third region III and extends to a partial sidewall of the semiconductor channel 102. The electrical connection layer 105 and the dielectric layer 103 jointly cover the surface of the semiconductor channel 102. An insulating layer 106 is formed and located between adjacent semiconductor channels 102 on the same bit line 101.

Figure 17:
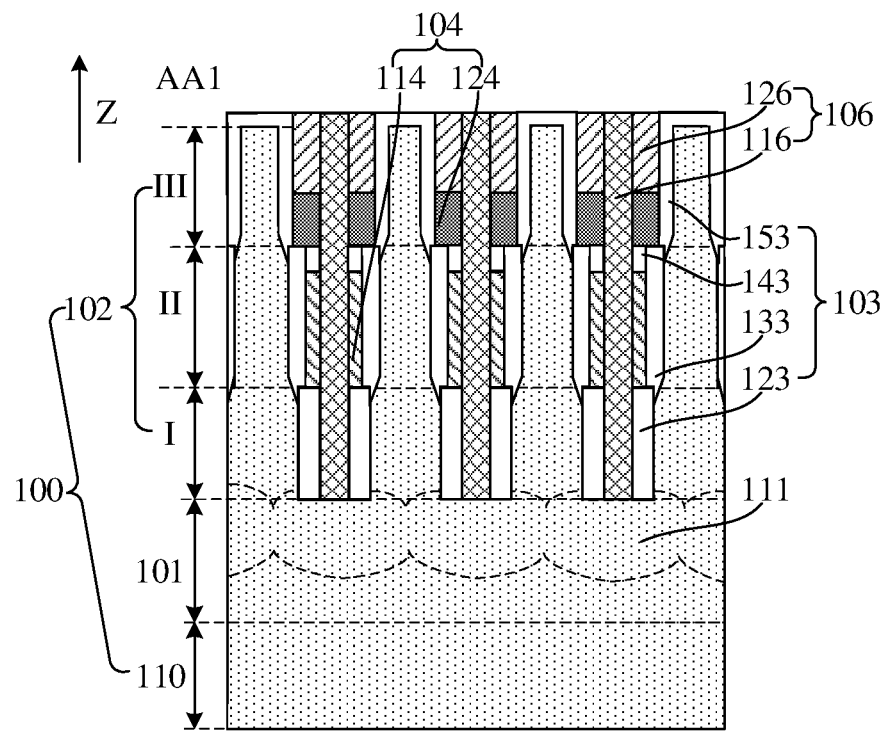

In some embodiments, with reference to FIG. 17, the gate structure 104 includes a first gate layer 114 and a second gate layer 124, and the step of forming the dielectric layer 103, the gate structure 104, and the insulating layer 106 may include the following steps.

Figure 10:
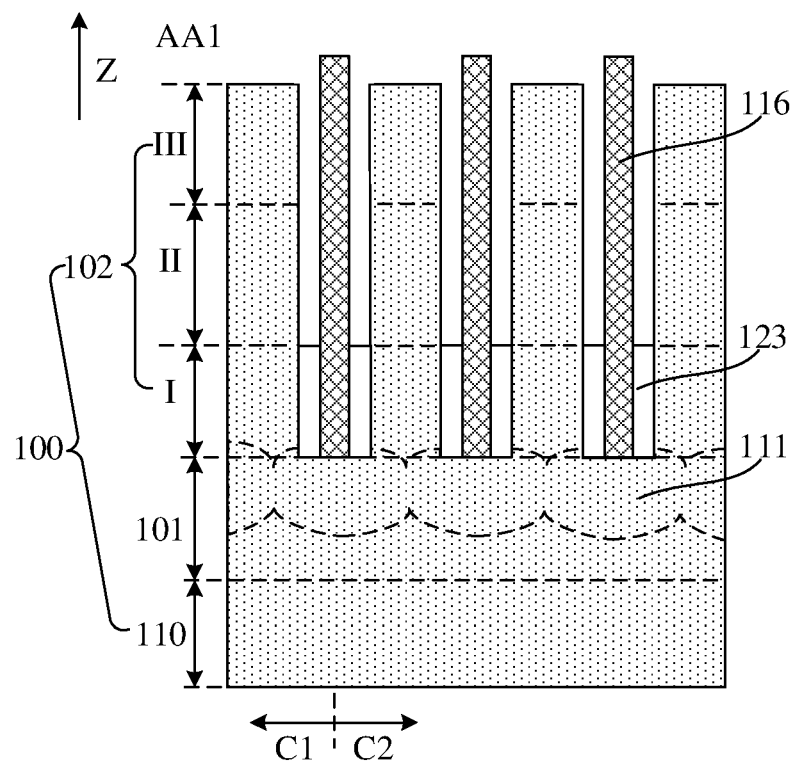

With reference to FIG. 10, a second dielectric layer 123 is formed on the sidewall of the trench 107 (with reference to FIG. 6) in the first region I. A first insulating layer 116 is formed and located in the trench 107, and isolates the adjacent second dielectric layers 123. The top surface of the first insulating layer 116 is not lower than the top surface of the semiconductor channel 102. The top surface of the first insulating layer 116 is not lower than the top surface of the semiconductor channel 102, which facilitates the subsequent formation of second gaps between the first insulating layer 116 and the semiconductor channels 102 in the second region II and the third region III. Then, the first gate layer and the second gate layer with precise dimensions can be formed in the second gaps through self-alignment. This is beneficial to simplifying the formation steps of the first gate layer and the second gate layer, and the size of the second gap is adjusted to obtain the first gate layer and the second gate layer in a small size.

The step of forming the second dielectric layer 123 and the first insulating layer 116 may include the following steps.

Figure 9:
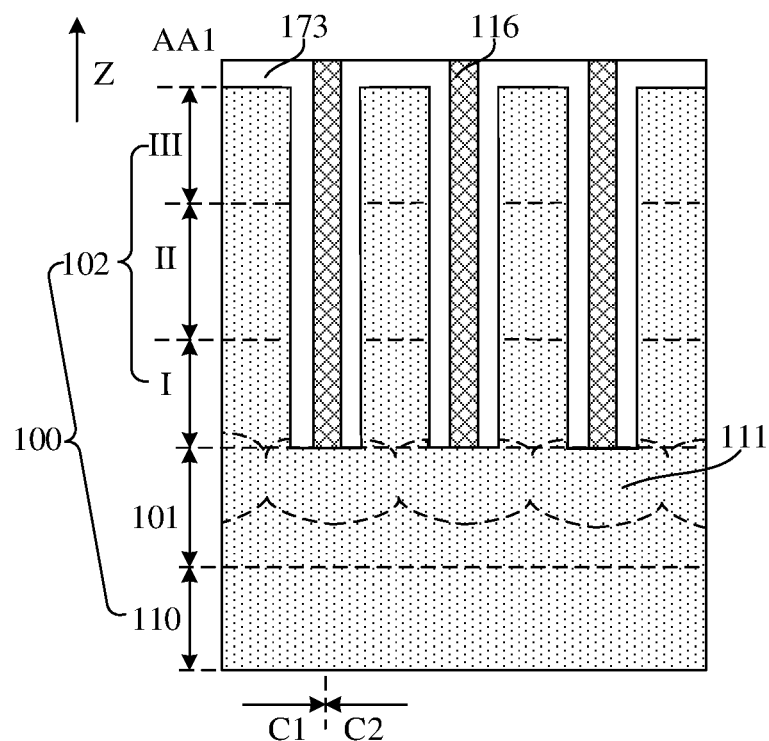

With reference to FIG. 9, a preliminary second dielectric layer 173 is formed on the sidewall of the trench 107 (with reference to FIG. 6), and a first gap is formed between adjacent preliminary second dielectric layers 173. In some embodiments, the initial second dielectric layer 173 may be formed by using the following process step: performing a deposition process to form a surface covering the top surface of the semiconductor channel 102 and exposing all sidewalls, and further form a top surface and a sidewall exposed by the initial first dielectric layer 163 (with reference to FIG. 8). The material of the initial second dielectric layer 173 includes silicon oxide.

With reference to FIG. 9, a first insulating layer 116 is formed in the first space. In some embodiments, the first insulating layer 116 may be formed by using the following process steps: forming a first insulating film covering the top surface of the initial second dielectric layer 173 and filling up the first space; and performing chemical mechanical planarization process on the first insulating film until the initial second dielectric layer 173 is exposed, where the retained first insulating layer is used as the first insulating layer 116. The material of the first insulating layer 116 includes silicon nitride.

The initial first dielectric layer 163 and the initial second dielectric layer 173 are made of a same material. This is beneficial to subsequently partially removing the initial first dielectric layer 163 and the initial second dielectric layer 173 in the same removal step, to form the second gap.

In some embodiments, with reference to FIGS. 6 to 9, after the trench 107 is formed and before the second dielectric layer 123 (with reference to FIG. 10) is formed, metal silicidation is performed on a part of the top surface of the bit line 101 exposed by the trench 107 to form a metal-semiconductor compound structure 111.

With reference to FIG. 9, the metal-semiconductor compound structure 111 have a smaller resistivity than unmetallized semiconductor materials. Therefore, compared to the semiconductor channel 102, the bit line 101 including the metal-semiconductor compound structure 111 has a smaller resistivity. This reduces the resistance of the bit lines 101 and the contact resistance between the bit lines 101 and the semiconductor channel 102 of the first region I, thereby further improving the electrical performance of the semiconductor structure.

In some embodiments, with reference to FIG. 9, the step of performing metal silicidation on the part of the top surface of the bit line 101 exposed by the initial second dielectric layer 173 may include: forming a metal layer (not shown in the figure) is formed on the exposed top surface of the bit line 101, and the metal layer provides metal elements for the metal-semiconductor compound structure 111. The material of the metal layer includes at least one selected from the group consisting of cobalt, nickel, molybdenum, titanium, tungsten, tantalum and platinum.

In other embodiments, the metal silicidation may not be performed on the exposed top surface of the bit line, and the second dielectric layer and the first insulating layer may be directly formed on the exposed top surface of the bit line.

Figure 11:
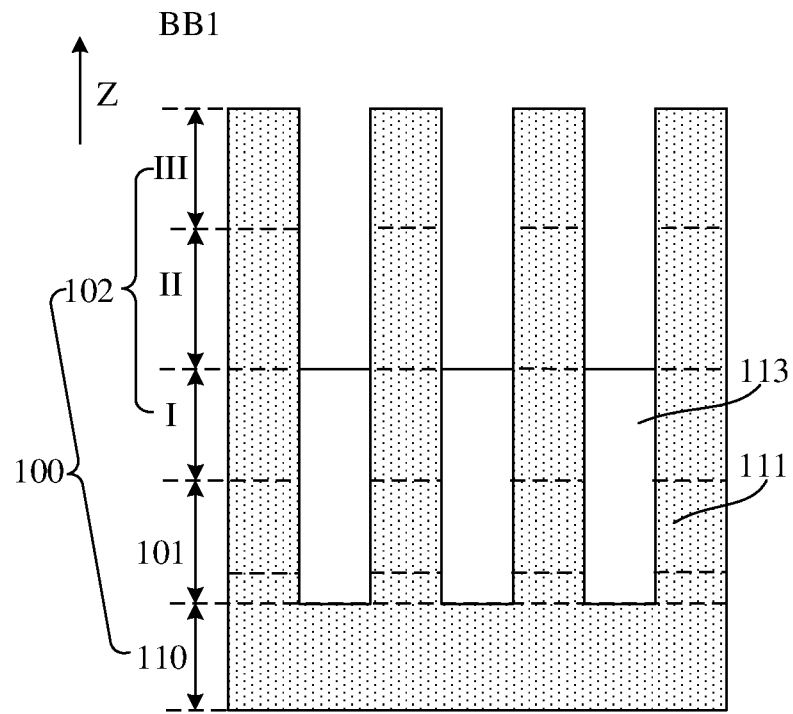

Then, with reference to FIGS. 9 to 11, the initial first dielectric layer 163 (with reference to FIG. 8) and the initial second dielectric layer 173 are etched by using the first insulating layer 116 as a mask to form the first dielectric layer 113 and the second dielectric Layer 123.

With reference to FIGS. 12 to 18, a third dielectric layer 133 and a first gate layer 114 are formed on the sidewall of the trench 107 (with reference to FIG. 6) in the second region II, where a top surface of the third dielectric layer 133 is higher than that of the first gate layer 114. A fourth dielectric layer 143 is formed, and located between the first insulating layer 116 and the third dielectric layer 133. A fifth dielectric layer 153 and a second gate layer 124 are formed on the sidewall of the trench 107 (with reference to FIG. 6) in the third region III, where a top surface of the fifth dielectric layer 153 is higher than that of the second gate layer 124. A second insulating layer 126 is formed and located between the first insulating layer 116 and the fifth dielectric layer 153, where the insulating layer 106 includes the first insulating layer 116 and the second insulating layer 126.

In some embodiments, the step of forming the third dielectric layer 133, the first gate layer 114, and the second insulating layer 126 may include the following steps.

Figure 12:
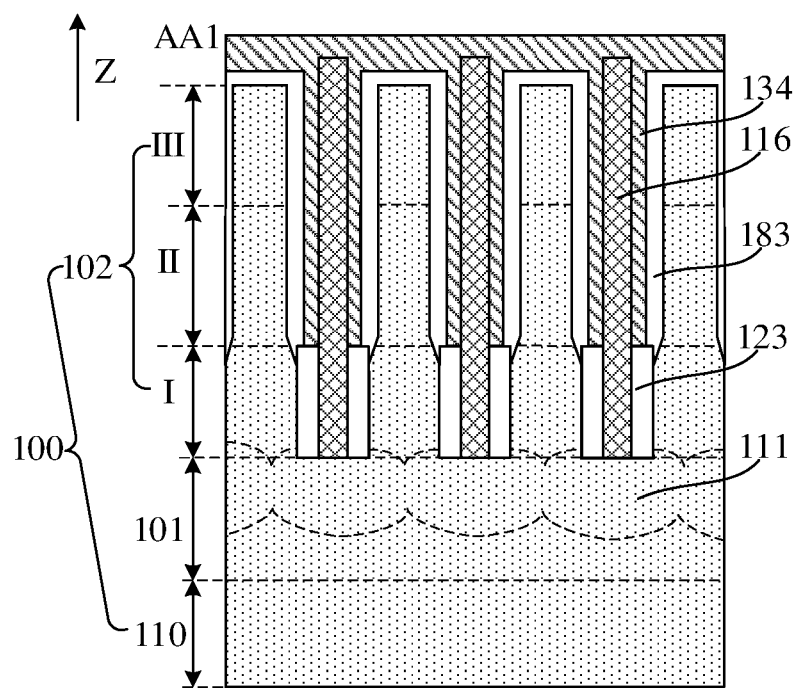
Figure 13:
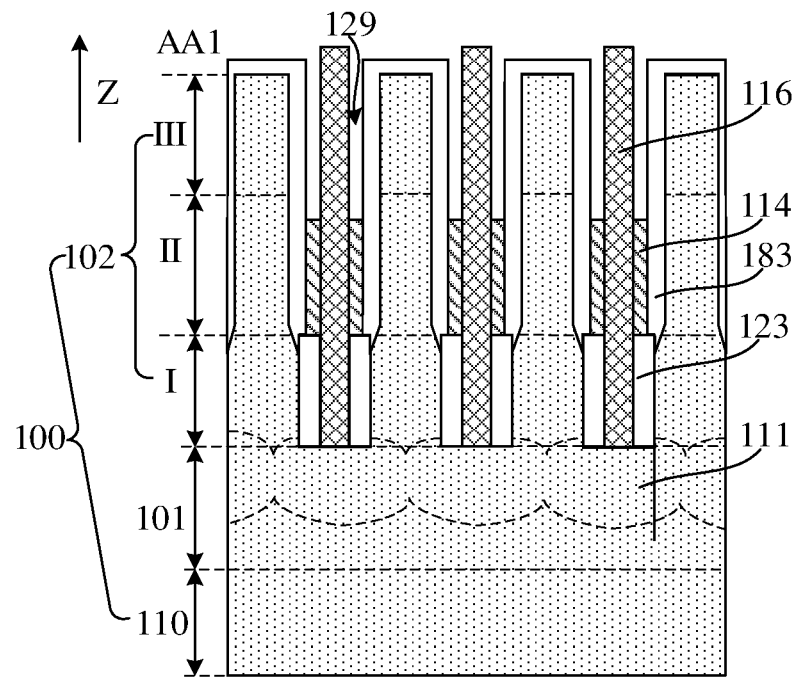
Figure 14:
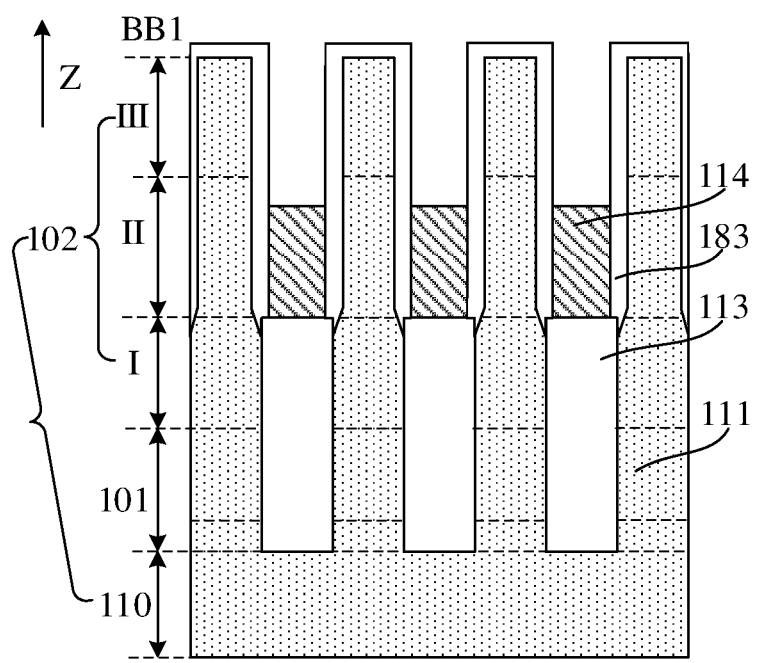

With reference to FIGS. 12 to 14, an initial third dielectric layer 183 is formed on the sidewalls of the semiconductor channels 102 in the second region II and the third region III, and a second gap 129 is formed between the initial third dielectric layer 183 and the first insulating layer 116. In some embodiments, the initial third dielectric layer 183 may be formed by the following process steps: performing thermal oxidation treatment on the exposed surfaces of the semiconductor channels 102 in the second region II and the third region III to form the initial third dielectric layer 183. The material of the initial third dielectric layer 183 is silicon oxide. In other embodiments, the initial third dielectric layer covering the surfaces of the semiconductor channels in the second region and the third region may further be formed through a deposition process.

With reference to FIGS. 13 and 14, the first gate layer 114 is formed in the second gap 129 of the second region II. The step of forming the first gate layer 114 may include: with reference to FIG. 12, forming an initial first gate layer 134, where the initial first gate layer 134 fills up the second gap 129 and is located on the top surface of the initial third dielectric layer 183; and with reference to FIG. 13, removing, through etching, the initial first dielectric layer 134 surrounding the sidewall of the semiconductor channel 102 in the third region III, partially surrounding the sidewall of the semiconductor channel 102 in the second region II, and located on the top surface of the initial third dielectric layer 183, where the remaining initial first gate layer 134 is used as the first gate layer 114, and the first gate layer 114 only partially surrounds the sidewall of the semiconductor channels 102 in the second region II.

Figure 15:
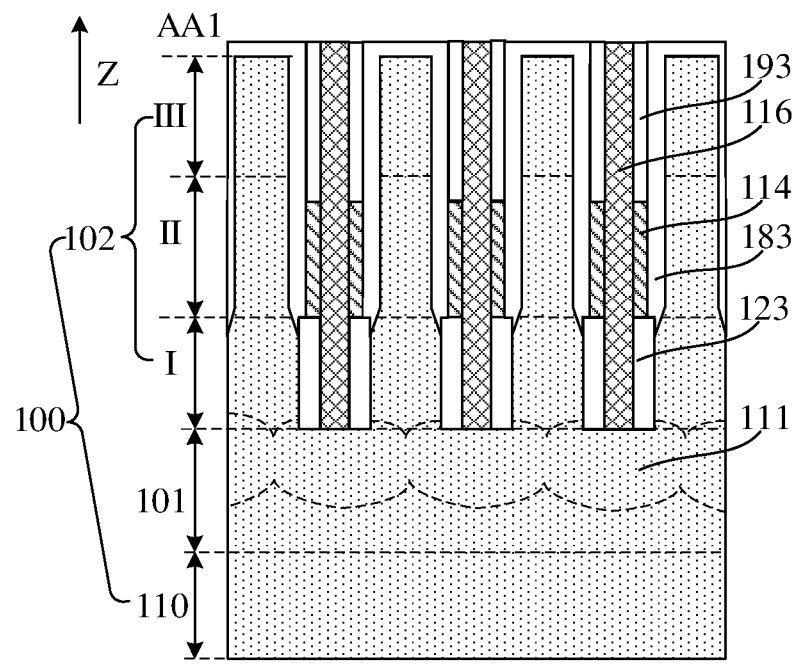

With reference to FIG. 15, an initial fourth dielectric layer 193 is formed in the remaining second spaces 129 (with reference to FIG. 13). In some embodiments, the initial fourth dielectric layer 193 may be formed by using the following process steps: performing a deposition process to form the initial fourth dielectric layer 193 that fills up the remaining second gap 129 and covers the top surface of the initial third dielectric layer 183; and performing chemical mechanical polishing on the initial fourth dielectric layer 193 until the initial third dielectric layer 183 is exposed. The material of the initial fourth dielectric layer 193 includes silicon oxide.

Figure 16:
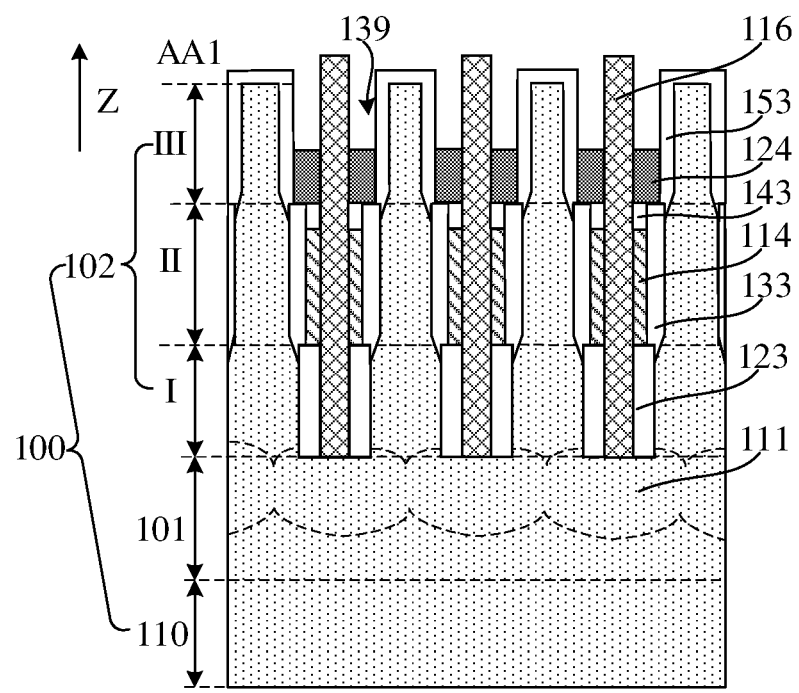

With reference to FIGS. 15 to 16, the first insulating layer 116 is used as a mask to etch the initial third dielectric layer 183 and the initial fourth dielectric layer 193, to form the third dielectric layer 133 and the fourth dielectric layer 143.

In some embodiments, the step of forming the fifth dielectric layer 153, the second gate layer 124, and the second insulating layer 126 may include the following steps.

With reference to FIG. 16, the fifth dielectric layer 153 is formed on the sidewall of the third region III, and a third gap 139 is formed between the fifth dielectric layer 153 and the first insulating layer 116. A second gate layer 124 is formed in a part of the third gap 139. In some examples, the fifth dielectric layer 153 is further formed on the top surface of the third region III, and the fifth dielectric layer 153 may be formed by using the following process steps: thermally oxidizing the surface of the semiconductor channel 102 in the third region III to form the fifth dielectric layers 153. The material of the fifth dielectric layer 153 is silicon oxide. In other embodiments, the initial fifth dielectric layer covering the surface of the semiconductor channel in the third region may further be formed through a deposition process.

With reference to FIG. 16, the step of forming the second gate layer 124 may include: forming an initial second gate layer (not shown in the figure), where the initial second gate layer fills up the third gap 139 and is located on the top surface of the fifth dielectric layer 153; and etching the initial second gate layer partially surrounding the sidewall of the semiconductor channel 102 in the third region and located on the top surface of the fifth dielectric layer 153, where the retained initial second gate layer is used as the second gate layer 124, and the second gate layer 124 only partially surrounds the sidewall of the semiconductor channel 102 in the third region III.

With reference to FIG. 17, the second insulating layer 126 is formed in the remaining third gap 139 (with reference to FIG. 16). In some embodiments, the following process steps may be used to form the second insulating layer 126: performing a deposition process, to form a second insulating film that fills up the retained third gap 139 and covers the top surface of the fifth dielectric layer 153; and performing chemical mechanical polishing on the second insulating film and the first insulating layer 116 until the fifth dielectric layer 153 is exposed, where the third insulating film is used as the second insulating layer 126. The material of the second insulating layer 126 may be silicon nitride.

In some embodiments, with reference to FIG. 17, after the second gate layer 124 is formed and before the second insulating layer 126 is formed, the manufacturing method may further include: doping at least one of lanthanide elements and/or zirconium into the second gate layer 124.

The doping at least one of lanthanide elements and/or zirconium into the second gate layer 124 may be performed through the following process: with reference to FIG. 16, forming a first diffusion layer (not shown in the figure) in the retained third gap 139, increasing the temperature of the environment in which the semiconductor structure is located, and doping metal elements into the second gate layer 124 through thermal diffusion of metal elements in the first diffusion layer. It should be noted that the doping depth of the metal elements in the second gate layer 124 increases as the temperature of the environment where the semiconductor structure is located increases. The material of the first diffusion layer may be at least one of lanthanide oxides such as lanthanum oxide, scandium oxide, or ceria or zirconium oxide.

After the process of doping at least one of the lanthanides and/or the zirconium element into the second gate layer 124 ends, the remaining diffusion layer is removed to expose the second gate layer 124 in preparation for the subsequent formation of the second insulating layer 126 on the top surface of the second gate layer 124.

Figure 18:
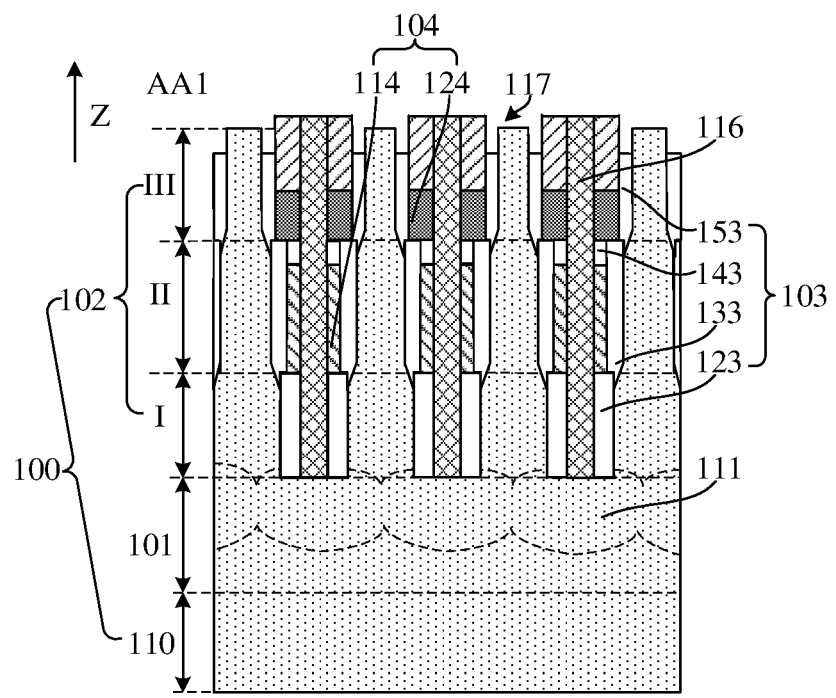

In some embodiments, with reference to FIGS. 3, 4, and 18, the step of forming the electrical connection layer 105 may include: etching the fifth dielectric layer 153 by using the insulating layer 106 as a mask, to expose the top surface and a partial sidewall of the third region III, and form a groove 117 between the insulating layer 106 and the third region III; and forming the electrical connection layer 105 filling up the groove 117.

The electrical connection layer 105 may be formed by using the following process steps: performing a deposition process to form a conductive film that fills up the groove 117 and covers the top surface of the insulating layer 106; performing chemical mechanical polishing on the conductive film until the insulating layer 106 is exposed, where the remaining conductive film is used as the electrical connection layer 105.

In some embodiments, the method of manufacturing the semiconductor structure may further include: with reference to FIG. 5, doping at least one of lanthanide elements and/or zirconium into the electrical connection layer 105. The doping at least one of lanthanide elements and/or zirconium into the electrical connection layer 105 may be performed through the following process: forming a second diffusion layer (not shown in the figure) on the top surface of the electrical connection layer 105, increasing the temperature of the environment in which the semiconductor structure is located, and doping metal elements into the electrical connection layer 105 through thermal diffusion of metal elements in the first diffusion layer. It should be noted that the doping depth of the metal elements in the electrical connection layer 105 increases as the temperature of the environment where the semiconductor structure is located increases. The material of the second diffusion layer may be at least one of lanthanide oxides such as lanthanum oxide, scandium oxide, or ceria or zirconium oxide.

At least one of the lanthanides and/or zirconium are/is doped into the electrical connection layer 105. In this way, the electrical performance of the electrical connection layer 105 is improved, thereby improving the transmission effect of electrical signals in the electrical connection layer 105, to improve the ability of the electrical signal transmitted to the semiconductor channel 102 through the electrical connection layer 105 to control the semiconductor channel 102. This is beneficial to improving the on/off sensitivity of the GAA transistor.

It should be noted that, in other embodiments, after the first gate layer is formed, the second insulating layer and the electrical connection layer may be formed directly on the top surface of the first gate layer, that is, the gate structure only includes the first gate layer.

In some embodiments, the method of manufacturing the semiconductor structure may further include: forming a conductive structure of another functional device on the top surface of the electrical connection layer 105 away from the bit line 101.

In summary, with reference to FIG. 3, the electrical connection layer 105 covering the top surface of the third region III of the semiconductor channel 102 and extending to a partial sidewall of the semiconductor channel 102 is formed, which therefore is beneficial to increasing the contact area between the electrical connection layer 105 and the semiconductor channel 102, reducing the contact resistance between the electrical connection layer 105 and the third region III of the semiconductor channel 102, and improving the transmission performance of electrical signals between the electrical connection layer 105 and the third region III of the semiconductor channel 102, thereby improving electrical properties of the semiconductor structure. Further, this is beneficial to improving the transmission performance of electrical signals between the other conductive structures and the third region III of the semiconductor channel 102, when the conductive structures of other functional devices are subsequently formed on the electrical connection layer 105. Therefore, from the above two aspects, it can be seen that the electrical connection layer 105 transmits electrical signals to the semiconductor channel 102, which is beneficial to improving the ability of the electrical signal to control the semiconductor channel 102, thereby improving the on/off sensitivity of the GAA transistor.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In a semiconductor structure and a manufacturing method thereof provided by the embodiments of the present disclosure, vertical GAA transistors are formed in a base, and bit lines are buried in the base and located under the semiconductor channel. Therefore, a 3D stacked semiconductor structure can be formed, and the transistors are arranged in a $4F^2$ manner to improve the integration density of the semiconductor structure. In addition, the electrical connection layer and the dielectric layer cover the surface of the semiconductor channel. The electrical connection layer not only covers the top surface of the third region of the semiconductor channel but also extends to a partial sidewall of the semiconductor channel, which therefore is beneficial to increasing the contact area between the electrical connection layer and the semiconductor channel, reducing the contact resistance between the electrical connection layer and the third region of the semiconductor channel, and improving the transmission performance of electrical signals between the electrical connection layer and the third region of the semiconductor channel, thereby improving electrical properties of the semiconductor structure. Further, this is beneficial to improving the transmission performance of electrical signals between the other conductive structures and the third region of the semiconductor channel, when the conductive structures of other functional devices are subsequently formed on the electrical connection layer. Therefore, the embodiments of the present disclosure are beneficial to improving the ability of the electrical signal that the electrical connection layer transmits to the semiconductor channel to control the semiconductor channel, thereby improving the on/off sensitivity of the GAA transistor.

The invention claimed is:

1. A semiconductor structure, comprising:
  a base, wherein the base comprises: bit lines arranged at intervals and extending along a first direction, and a semiconductor channel located on partial top surfaces of the bit lines, and along a direction from the bit line to the semiconductor channel, the semiconductor channel comprises a first region, a second region, and a third region that are arranged sequentially;
  a dielectric layer located between adjacent two of the bit lines and on a sidewall of the semiconductor channel;
  a gate structure at least surrounding the dielectric layer in the second region and extending along a second direction, wherein the first direction is different from the second direction;
  an electrical connection layer covering a top surface of the third region and extending to a partial sidewall of the semiconductor channel, wherein the electrical connection layer and the dielectric layer cover a surface of the semiconductor channel; and
  an insulating layer located between adjacent two of the semiconductor channels on a same bit line and isolating the gate structure as well as the electrical connection layer on adjacent two of the dielectric layers;
  wherein the gate structure comprises:
    a first gate layer surrounding the dielectric layer in the second region and extending along the second direction; and
    a second gate layer surrounding the dielectric layer in the third region, wherein in a direction perpendicular to a top surface of the bit line, the second gate layer and the first gate layer are disposed at intervals;
  wherein along the direction from the bit line to the semiconductor channel, a ratio of a height of the first gate layer surrounding a sidewall of the second region to a height of the semiconductor channel in the second region is 1/2 to 9/10.

2. The semiconductor structure according to claim 1, wherein the electrical connection layer comprises at least one of lanthanides or zirconium.

3. The semiconductor structure according to claim 1, wherein along the direction from the bit line to the semiconductor channel, the electrical connection layer on the top surface of the third region is 10 nm to 50 nm.

4. The semiconductor structure according to claim 1, wherein along a direction perpendicular to the sidewall of the semiconductor channel, a ratio of a width of the electrical connection layer on the sidewall of the semiconductor channel to a width of the semiconductor channel in the third region is 1/5 to 3/5.

5. The semiconductor structure according to claim 1, wherein along the direction from the bit line to the semiconductor channel, a ratio of a height of the electrical connection layer on the sidewall of the semiconductor channel to a height of the semiconductor channel in the third region is 1/5 to 3/5.

6. The semiconductor structure according to claim 1, wherein an orthographic projection of the electrical connection layer on the bit line is not overlapped or partially overlapped with an orthographic projection of the gate structure on the bit line.

7. The semiconductor structure according to claim 1, wherein in a plane perpendicular to the sidewall of the semiconductor channel, a cross-sectional area of the semiconductor channel in the first region, a cross-sectional area of the semiconductor channel in the second region, and a cross-sectional area of the semiconductor channel in the third region are decreased sequentially.

8. The semiconductor structure according to claim 1, wherein along the first direction, a side surface of the second gate layer away from the sidewall of the semiconductor channel is flush with a side surface of the first gate layer away from the sidewall of the semiconductor channel.

9. The semiconductor structure according to claim 1, wherein in a direction perpendicular to the sidewall of the semiconductor channel, the first gate layer is thinner than the second gate layer.

10. The semiconductor structure according to claim 1, wherein along the direction from the bit line to the semiconductor channel, a ratio of a height of the first gate layer surrounding a sidewall of the second region to a height of the semiconductor channel in the second region is 1/2 to 9/10.

11. The semiconductor structure according to claim 1, further comprising a metal-semiconductor compound structure at least located in a bit line opposite to a bottom of the insulating layer.

12. The semiconductor structure according to claim 11, wherein along a direction from the semiconductor channels located at two sides of the insulating layer to the insulating layer, the metal-semiconductor compound structure becomes deeper.

13. A method of manufacturing a semiconductor structure, comprising:
  providing a base, wherein the base comprises: bit lines arranged at intervals and extending along a first direction, and a semiconductor channel located on partial top surfaces of the bit lines, and along a direction perpendicular to the top surface of the bit line, the semiconductor channel comprises a first region, a second region, and a third region that are arranged sequentially;
  forming a dielectric layer located between adjacent two of the bit lines and on a sidewall of the semiconductor channel;
  forming a gate structure at least surrounding the dielectric layer in the second region and extending along a second direction, wherein the first direction is different from the second direction;
  forming an electrical connection layer covering a top surface of the third region and extending to a partial sidewall of the semiconductor channel, wherein the electrical connection layer and the dielectric layer cover a surface of the semiconductor channel; and
  forming an insulating layer located between adjacent two of the semiconductor channels on a same bit line;
  wherein the gate structure comprises:
    a first gate layer surrounding the dielectric layer in the second region and extending along the second direction; and a second gate layer surrounding the dielectric layer in the third region, wherein in a direction perpendicular to a top surface of the bit line, the second gate layer and the first gate layer are disposed at intervals;

wherein along the direction from the bit line to the semiconductor channel, a ratio of a height of the first gate layer surrounding a sidewall of the second region to a height of the semiconductor channel in the second region is 1/2 to 9/10.

14. The method of manufacturing according to claim 13, wherein the providing a base comprises:

providing an initial base, wherein an initial first dielectric layer extending along the first direction is disposed in the initial base; and patterning the initial base and the initial first dielectric layer, to form the bit lines arranged at intervals, the semiconductor channel, and the initial first dielectric layer located between adjacent bit lines, wherein a top surface of the initial first dielectric layer is not lower than a top surface of the semiconductor channel, the sidewall of the semiconductor channel, a sidewall of the initial first dielectric layer, and the partial top surface of the bit line define a trench, and the trench extends along the second direction.

15. The method of manufacturing according to claim 14, wherein the forming the dielectric layer, the gate structure, and the insulating layer comprise:

forming a second dielectric layer on a sidewall of the trench in the first region;

forming a first insulating layer, wherein the first insulating layer is located in the trench and isolates adjacent two of the second dielectric layers, and a top surface of the first insulating layer is not lower than the top surface of the semiconductor channel;

forming a third dielectric layer and a first gate layer on the sidewall of the trench in the second region, wherein a top surface of the third dielectric layer is higher than a top surface of the first gate layer;

forming a fourth dielectric layer located between the first insulating layer and the third dielectric layer;

forming a fifth dielectric layer and a second gate layer on the sidewall of the trench in the third region, wherein a top surface of the fifth dielectric layer is higher than a top surface of the second gate layer; and forming a second insulating layer located between the first insulating layer and the fifth dielectric layer, wherein the insulating layer comprises the first insulating layer and the second insulating layer.

16. The method of manufacturing according to claim 15, wherein after the trench is formed, and before the second dielectric layer is formed, metal silicidation is performed on a partial top surface of the bit line exposed by the trench, to form a metal-semiconductor compound structure.

17. The method of manufacturing according to claim 15, wherein the forming an electrical connection layer comprises:

etching the fifth dielectric layer by using the insulating layer as a mask, until the top surface and a partial sidewall of the third region are exposed, to form a groove between the insulating layer and the third region; and forming the electrical connection layer filling up the groove.

18. The method of manufacturing according to claim 13, further comprising: doping at least one of lanthanides or zirconium into the electrical connection layer.

* * * * *